United States Patent [19]

Yamazaki

[11] Patent Number: 5,205,036
[45] Date of Patent: Apr. 27, 1993

[54] METHOD OF MANUFACTURING A SEMICONDUCTOR DEVICE WITH SELECTIVE COATING ON LEAD FRAME

[75] Inventor: Shunpei Yamazaki, Tokyo, Japan

[73] Assignee: Semiconductor Energy Laboratory Co., Ltd., Kanagawa, Japan

[21] Appl. No.: 920,161

[22] Filed: Jul. 27, 1992

Related U.S. Application Data

[60] Continuation-in-part of Ser. No. 731,871, Jul. 18, 1991, abandoned, which is a division of Ser. No. 417,319, Oct. 5, 1989, Pat. No. 5,057,900.

[30] Foreign Application Priority Data

Oct. 17, 1988 [JP] Japan .................. 63-261963
Oct. 17, 1988 [JP] Japan .................. 63-261964

[51] Int. Cl.⁵ .................. H01R 43/20; H01L 21/60
[52] U.S. Cl. .................. 29/856; 29/827; 437/217
[58] Field of Search .................. 29/460, 622, 827, 841, 29/854, 855, 856; 156/643, 646; 204/165, 192.1, 192.32; 228/243; 357/69–74; 427/38–42, 96, 98; 437/211, 214, 215, 217, 220

[56] References Cited

U.S. PATENT DOCUMENTS

| 3,795,044 | 3/1974 | Peltz | 437/211 |
| 3,878,554 | 4/1975 | Mikome et al. | 357/71 X |
| 4,079,511 | 3/1978 | Grabbe | 29/827 |
| 4,396,458 | 8/1983 | Platter et al. | 427/126.3 X |
| 4,461,924 | 7/1984 | Butt | 29/827 |
| 4,486,945 | 12/1984 | Aigoo | 357/73 |
| 4,562,091 | 12/1985 | Sachdev et al. | 427/41 |
| 4,707,724 | 11/1987 | Suzuki et al. | 437/211 X |
| 4,770,897 | 9/1988 | Wu | 427/54.1 X |
| 4,862,586 | 9/1989 | Osada | 29/827 |
| 4,878,990 | 11/1989 | Dugan et al. | 29/827 X |
| 4,888,449 | 12/1989 | Crane et al. | 29/827 X |
| 5,070,041 | 12/1991 | Katayama et al. | 437/214 |

FOREIGN PATENT DOCUMENTS 2090466 7/1982 United Kingdom .................. 29/827

Primary Examiner—Joseph M. Gorski
Assistant Examiner—Peter Dungba Vo
Attorney, Agent, or Firm—Sixbey, Friedman, Leedom & Ferguson

[57] ABSTRACT

A method for manufacturing a lead frame for assemble with a semiconductor device comprises the steps of covering, with a cover film, a die to which an electronic device is attached and a conducting section of a lead section to be electrically connected to the die, covering the whole of the die and lead section and the cover film with an inorganic protective film, and removing the cover film and the protective film formed over the cover film to partly expose the die and the conducting section for electric connection.

12 Claims, 5 Drawing Sheets

METHOD OF MANUFACTURING A SEMICONDUCTOR DEVICE WITH SELECTIVE COATING ON LEAD FRAME

This application is a continuation-in-part of Ser. No. 07/731,871, filed Jul. 18, 1991, now abandoned, which itself was a divisional of Ser. No. 07/417,319 filed Oct. 5, 1989, now U.S. Pat. No. 5,057,900.

BACKGROUND OF THE INVENTION

1. Field of The Invention

The present invention relates to a method for manufacturing a lead frame or substrate, and in particular, to a method for manufacturing a lead frame or substrate for an electronic device such as a DIP or Flat Pack Package wherein a semiconductor or the like is mounted on the lead frame or substrate or the like in the electronic device and sealed in a molding material.

2. Description of the Prior Art

FIG. 1 shows the cross section of one part of a conventional electronic device. In FIG. 1, a lead frame 1 is made of a metal such as a copper, 42ALLOY or the like, and comprises a die 1a for mounting a semiconductor chip 3, and a lead section, that is an inner lead 1b and an outer lead 1c. The semiconductor chip 3 is die-attached e.g. by printing gold onto the surface of the die 1a, so that a gold-silicon alloy is formed at 300° C. to 400° C., and the semiconductor chip 3 is mounted using the gold-silicon alloy as an adhesive 5. In place of the gold-silicon alloy, it is also possible to use an adhesive such as an organic resin of a polyimide type or of an epoxy type, or a silver paste containing an organic material, or the like. An excess 5a of the adhesive is squeezed out during the mounting operation as shown in the drawing. The semiconductor chip 3 and the inner lead 1b are wire-bonded using a gold wire 9, after which the entire package is sealed in a plastic molding 7 with the exception of the outer lead 1c which is to be exposed.

When an organic adhesive is used as the adhesive 5, the adhesive in the flowable state is hardened by a chemical or thermochemical reaction, so that the semiconductor chip is mounted to the die 1a. This method has the advantages that it is inexpensive and easily adaptable to mass production. However, on the other hand, the adhesive 5 and the excess adhesive 5a are gradually vaporized and moved as indicated by the arrow 5b when heated in the range of 100° to 300° C., and an adhering material 5c is formed on the surface of the semiconductor chip 3 and lead frame 1. In addition, natural oxide and a suboxide 15 are formed on the lead frame 1. The adhering material 5c and the suboxide 15 are extremely easy to strip from the surface of the lead frame and therefore end up damaging the adherence of the subsequently-applied molding and protective film to the lead frame 1.

At the rear surface of the lead frame 1, it is easy for moisture to permeate into the plastic molding 7 from outside and to be accumulated thereon. When the device is usually dipped into molten solder, due to heat distortion or sudden expansion of vaporizing water, stress is produced causing the molding to expand. For this reason, cracks 11 and voids 13 are produced at the boundary between the die 1a and the molding 7 in areas where the adherence is poor.

SUMMARY OF THE INVENTION

An object of the present invention is to provide, with due consideration to the drawbacks of such conventional electronic devices, an electronic device with high reliability.

Another object of the present invention is to provide a method for manufacturing an electronic device of mold package type having an increased moisture resistance and adherence.

Another object of the present invention is to provide a package of the electronic device enclosed in a molding material with the prevention of the occurrence of cracks and voids in the package.

These objects are achieved in the present invention by the provision of a single-layer or multi-layer protective film of an inorganic material such as silicon nitride, silicon oxide, silicon carbide, or DLC (Diamond-Like Carbon), or the like, to cover the lead frame other than the electric contacts of the lead frame.

Specifically, in the present invention, the electric contacts of the lead frame (for example, parts which are wirebonded, and parts which are attached to the semiconductor chip) are first covered with a cover film, then a protective film is formed of an inorganic material over the lead frame, after which, using the lift-off method, the cover film and the protective film formed over it are removed to once again expose the electric contacts.

In the present invention, the properties of organic resin molding materials, that is poor adherence to metals and good adherence to inorganic materials, are utilized. By means of the present invention, because the lead frame is covered in advance by a protective film, it is possible to avoid the soiling of the lead frame in the subsequent process in which the electronic parts are attached by means of an adhesive. In addition, because adhering material and suboxides are removed from the surface of the lead frame, the adherence of the material to the lead frame is improved. Also, the permeation of moisture through the undersurface of the package over a long period of time can be prevented, and there is no drop in reliability. Otherwise, the drop of reliability would be caused by water and chlorine in the organic resin, by the occurrence of a reaction between the water and chlorine and the metal of the die, resulting in the formation of suboxides. For this reason, there is no breakage, no matter how thin the molding, and no swelling from the application of heat when the package is mounted onto the PCB.

In addition, because the lead frame is protected by inorganic materials, the electronic device can be handled without so much carefulness, so that there is no drop in yield, and mass production is possible.

BRIEF DESCRIPTION OF THE DRAWINGS

These and other objects, features, and advantages of the present invention will become more apparent from the following description of the preferred embodiments taken in conjunction with the accompanying drawings, in which.

DETAILED DESCRIPTION OF THE PREFERRED EMBODIMENTS

Figure 1:
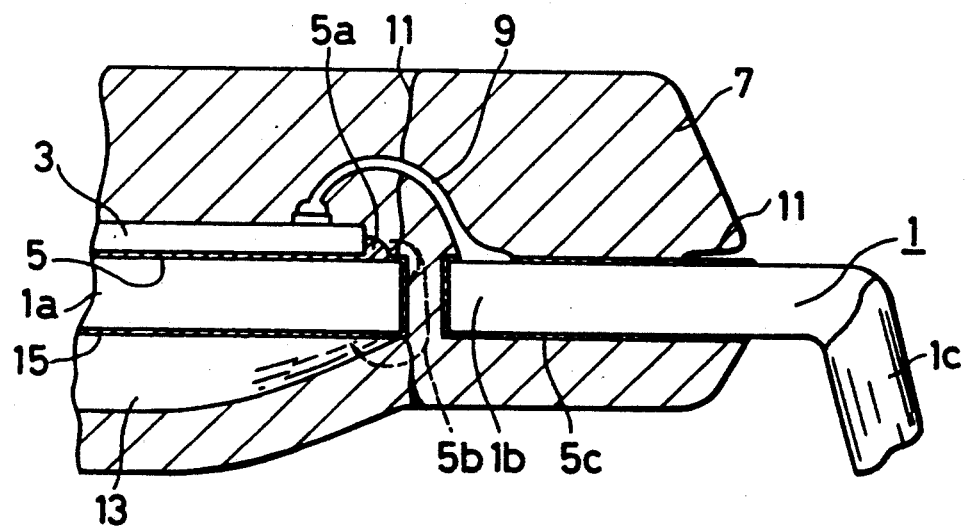
FIG. 1 is a vertical sectional view showing one part of a conventional plastic package semiconductor device after a moisture resistance test and solder test have been performed.
Figure 2:
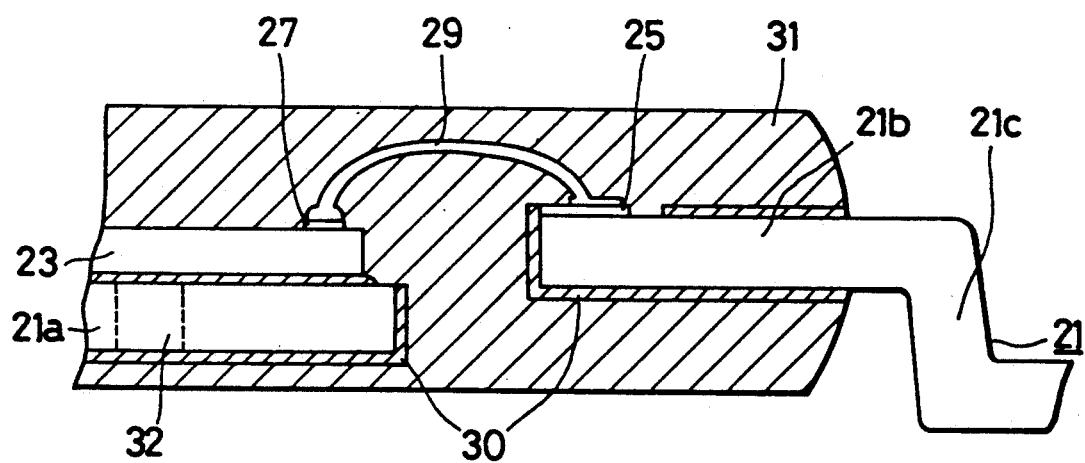
FIG. 2 is a vertical sectional view showing one part of a plastic type of semiconductor device using a lead frame in accordance with the present invention.

FIG. 2 is a vertical sectional view showing a Flat Pack Package Type of a semiconductor device using the lead frame produced in accordance with the present invention. In FIG. 2, a lead frame 21 made from 42ALLOY or copper comprises a die 21a for die-attaching a semiconductor chip 23, and a lead section, that is an inner lead 21b and an outer lead 21c. The surface of the die 21a and the inner lead 21b are covered with an inorganic material 30 with the exception of the part on which the semiconductor chip 23 is mounted, and of a connection part 25 on which gold is printed for wire-bonding. The semiconductor chip 23 is electrically connected to a portion 25 of the inner lead 21b (where gold plating has been applied) through an aluminum pad 27 and a gold wire 29 for wire-bonding, and they are sealed by a molding 31.

Next, the process for manufacturing the lead frame of the present invention will be explained with reference to FIGS. 3A to 3D.

Figure 3A:
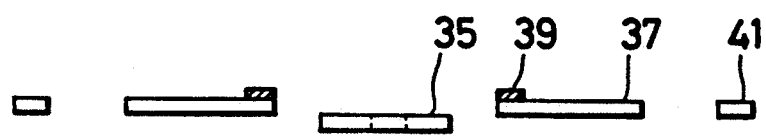
FIG. 3A to FIG. 3D are drawings showing the manufacturing process for a lead frame in accordance with the present invention.
Figure 3B:
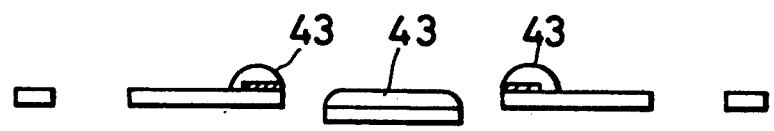

FIG. 3A is a sectional view of the lead frame which comprises a die 35 for mounting a semiconductor chip thereon, a lead section 37, a portion 39 on the lead section 37 for electrically connection by wire bonding, and a frame 41 for the lead frame. The die 35 is provided in a position lower than the lead section 37, so that a contact section provided on the chip is made on the same level or flush with the connecting portion 39. The lead frame is selectively subjected to a screen printing method in a region where it is not desired to form an inorganic protective film, specifically, on the upper surface of the die 35 on which the semiconductor chip is mounted and on the connecting portion 39 of the lead section, so that a cover 43 of organic resin such as epoxy resin or polyimide is formed thereon, as shown in FIG. 3B, by the screen printing method.

Figure 3C:
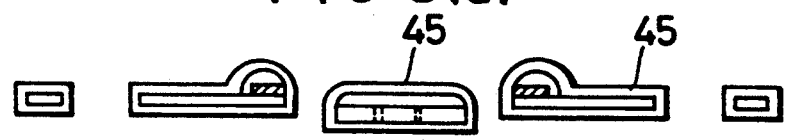

Subsequently, as shown in FIG. 3C, a protective film 45 of an inorganic material, such as silicon nitride, silicon oxide, silicon carbide, or DLC, is formed over the entire lead frame by a plasma CVD or sputtering method (which will later be explained in detail). The inorganic material must show no qualitative changes when held for one hour in air at 500° C., must be heatresistant, and must be resistant to oxidation. For this reason silicon nitride or silicon carbide are particularly superior for this application.

Figure 3D:
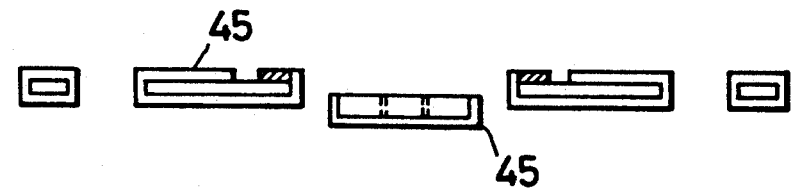

Next, the entire body is immersed in an organic solvent such as acetone or NMP (N methyl 2 pyrrolidone) and treated with ultrasonic waves to dissolve the organic material 43 to be removed, while at the same time the covering protective film thereon is removed by the lift-off method. The lead frame of the present invention as shown in FIG. 3D is manufactured in this manner.

Figure 4A:
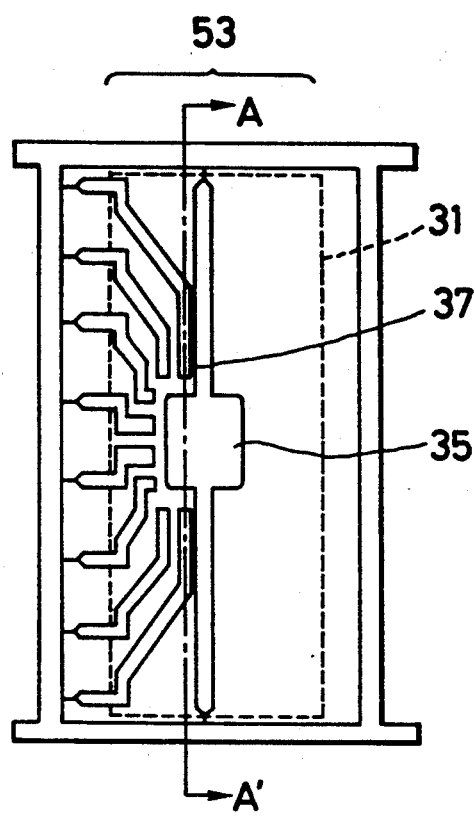
FIG. 4A is a drawing showing generally a lead frame made in accordance with the present invention, wherein the lead frame is separated from the adjacent lead frames.
Figure 4C:
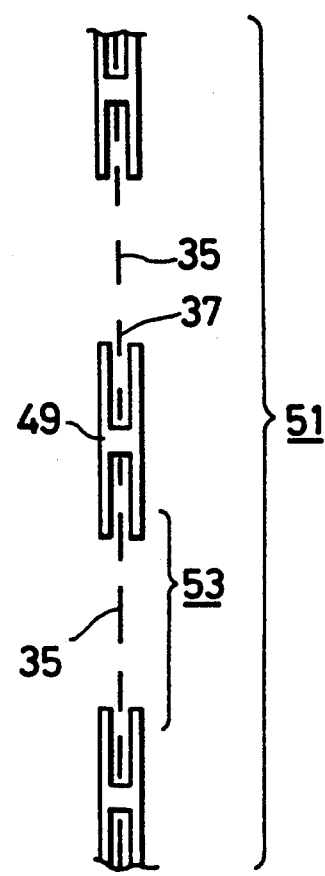
FIG. 4C is a sectional view of substrate board which comprises a plurality of substrates assembled with a jig.
Figure 4B:
FIG. 4B is a drawing showing a substrate to which a plurality of the lead frames of FIG. 4A have been assembled.
Figure 5:
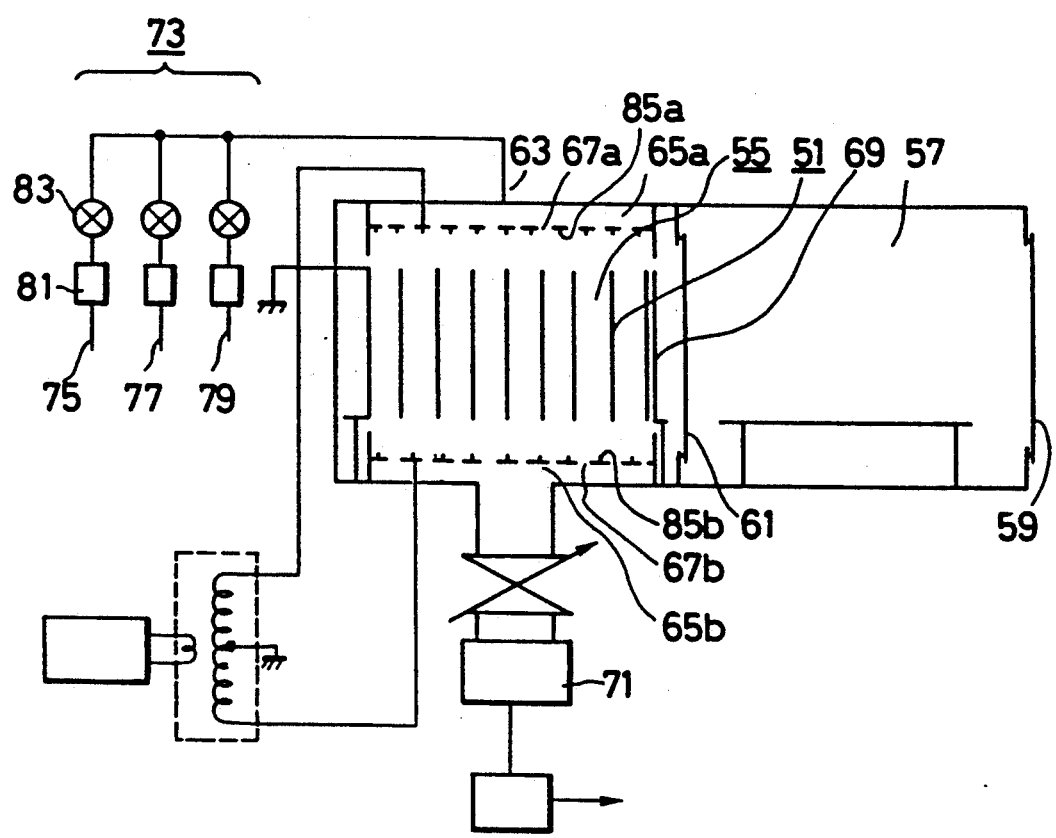
FIG. 5 is a drawing showing an external view of the plasma CVD device used in the present invention.

The cross section A—A' of the lead frame of FIG. 4A corresponds to the lead frame shown in FIGS. 3A to 3D. FIG. 4A shows the smallest single unit of the lead frame, while FIG. 4B shows a plurality of these units (5 to 25) assembled in a single substrate. (N.B. This assembly is also called a lead frame. However, to avoid confusion, it will be referred to here as a substrate). For simplicity, the right side of FIG. 4A has been partly omitted. As shown in FIG. 4C, 5 to 300 units of the substrate 47 are integrated by means of a jig 49 to give one substrate board 51.

FIG. 4C shows one part of the cross section, viewed from the side of the substrate board 51. On this substrate board 51, the protective film is formed as shown in FIG. 3 by the method detailed later. The part 53 in FIG. 4C corresponds to the part 53 shown in FIG. 4A.

FIG. 5 shows an exterior view of a plasma CVD device for forming a nitride film on the surface of the substrate board 51. In FIG. 5, a preparation chamber 57 is provided beside a reaction chamber 55 with a gate valve 61 positioned between them. A reaction space is enclosed by a frame-structured holder 69, a supply side hood 65a and a discharge side hood 65b. A gate valve 59 is provided so that the substrate board 51 can be placed in or removed from the preparation chamber 57. Five to fifty units of the substrate board 51 shown in FIG. 4C (FIG. 5 shows seven units) are positioned in positive polarity in the reaction chamber 55. A gas introduction system 73 is provided, such that argon gas for a plasma treatment is introduced by means of a line 75, nitrogen or ammonia by means of a line 77, then a silicon chemical compound vapor, for example, disilane ($Si_2H_6$) by means of a line 79 through a flowmeter 81 and a valve 83 for each line into the reaction chamber 55 by means of a gas introduction port 63.

First, a vacuum of $1 \times 10^{-3}$ to $1 \times 10^{-8}$ Torr, and preferably $5 \times 10^{-4}$ Torr to $1 \times 10^{-8}$ Torr, is drawn on the reaction chamber 55 using a turbo-molecular pump and maintained from 5 to 15 minutes. In this way, the undesirable vapors throughout the adhesive are drawn out and quickly exhausted to the outside. Next, a reactive gas (here, a mixture of disilane and nitrogen gas in the ratio of disilane to nitrogen gas = 1:5) is introduced through the gas introduction port 63, passes through the supply side hood 65a, and through a nozzle 67a into a space in the reaction chamber 55 enclosed by a frame-structured holder 69, the hood 65a and the hood 65b. Here, electric power of 1 kilowatt and 13.56 MHz was supplied to a pair of electrodes 85a, 85b provided on the inside of the supply side hood 65a and the discharge side hood 65b. A film of a thickness of 300 to 5000 Å is formed at a temperature from room temperature to 300° C., generally a film of a thickness of 1000 Å (1000Å ± 200Å) is formed at an average deposition rate of about 3Å/sec for about 10 minutes.

The silicon nitride film formed in this manner in an example had a dielectric strength of $8 \times 10^6$ V/cm or greater and the specific resistance was $2 \times 10^{15}$ $\Omega$cm. The infrared absorption spectrum in the example showed a Si-N bond absorption spectrum of 864 cm$^{-1}$, and the refractive index was 2.0.

Reliability tests were then performed on three hundred of the electronic devices using the lead frame of the present invention as shown in FIG. 2, where the electronic devices were stored under 85° C./85% RH continuous for moisture absorption by the plastic molding, then heated at 260° C. for 3 sec. The results are shown in the following table.

| No. | Film Thickness (Å) | Absorption Ratio (Wt %) | Cracks |
| --- | --- | --- | --- |
| 1 | 200 | 0.248 | 0/20 |
| 2 | 500 | 0.251 | 0/20 |
| 3 | 1000 | 0.238 | 0/20 |
| 4 | 500 | 0.241 | 0/20 |
| 5 | 2000 | 0.250 | 0/20 |
| 6 | No Film | 0.259 | 20/20 |

As indicated in the results No. 1 to No. 5, there were no defective samples, specifically none of twenty samples were defective, where the protective film was formed. In the case of No. 6, where no protective film was formed, out of twenty samples all were defective.

In this embodiment, the cover film which covers the conductive section may be made of an inorganic material, and the forming method used may be the sputtering method, ion plating method, or other physical film forming methods. The die of the lead frame of this embodiment is positioned lower than the lead, so that the surface of the electronic part and the surface of the lead were made almost the same height, but it is acceptable to coat the lead frame having a previously provided flat surface with an inorganic material and then indenting the die section downward. In addition, it is acceptable to form an opening 32 as shown in FIG. 2 to compensate for the heat distortion.

The present invention is not limited to the preferred embodiment. For example, the present invention can be applied to a hybrid IC provided with a metal and a condenser are attached. Also, not only wire-bonding, but flip chip bonding or solder bump bonding can be used.

What is claimed is:

1. A method for forming an electric device including at least a lead frame, a semiconductor device mounted on said lead frame, and an electrical connection between said lead frame and a terminal of said semiconductor device, said method comprising the sequential steps of:
   coating a protective film on said lead frame except for the portions on which said semiconductor device is to be mounted and said electrical connection will be made;
   said semiconductor device on the lead frame;
   making said electrical connection between said terminal of said semiconductor device and an uncoated portion of the lead frame; and
   encapsulations the lead frame having said protective coating formed thereon with an organic material.

2. The method of claim 1 wherein said terminal and said portion are electrically connected by wirebonding.

3. The method of claim 1 wherein said electric device is a semiconductor chip.

4. The method of claim 1 wherein said protective film is selected from the group of silicon nitride, silicon oxide, silicon carbide and DLC (Diamond-Like Carbon).

5. The method of claim 1 wherein said protective film is 300 to 5000Å.

6. The method of claim 1 wherein said protective film is formed by a plasma CVD method.

7. A method for forming a protective film on a lead frame having a portion on which a semiconductor device will be mounted and a portion on which electrical connections are made with said semiconductor device comprising the steps of:
   coating a removable cover film on the portions of a lead frame on which said semiconductor device will be mounted and on which said electrical connections will be made;
   coating a protective film on the surface of the lead frame and on said removable cover film on said lead frame; and
   removing said cover film together with the protective film formed over said portions of said lead frame on which electric contacts will be made.

8. The method of claim 7 wherein said protective film is selected from the group of silicon nitride, silicon oxide, silicon carbide and DLC 9. The method of claim 7 wherein said protective film is 300 to 500Å thick.

10. The method of claim 7 wherein said protective film is formed by a plasma CVD method.

11. The method of claim 7 wherein said cover film is removed by the use of an organic solvent and ultrasonic waves.

12. The method of claim 7 wherein said cover film is made of organic resin.

* * * * *